United States Patent
Iwata et al.

(10) Patent No.: US 8,428,448 B2
(45) Date of Patent: Apr. 23, 2013

(54) WALKING BEAM TYPE HEAT TREATMENT APPARATUS

(75) Inventors: Takashi Iwata, Nagoya (JP); Yoshizumi Ito, Nagoya (JP); Katsuhiro Kano, Nagoya (JP)

(73) Assignee: Noritake Co., Limited, Nagoya-Shi (JP)

( * ) Notice: Subject to any disclaimer, the term of this patent is extended or adjusted under 35 U.S.C. 154(b) by 811 days.

(21) Appl. No.: 12/588,587

(22) Filed: Oct. 20, 2009

(65) Prior Publication Data

US 2010/0195992 A1    Aug. 5, 2010

(30) Foreign Application Priority Data

Apr. 3, 2007  (JP) ................................. 2007-097747

(51) Int. Cl.
*A21B 2/00*    (2006.01)
(52) U.S. Cl.
USPC ........................... 392/418; 392/416; 432/121
(58) Field of Classification Search .................. 392/416, 392/418
See application file for complete search history.

(56) References Cited

U.S. PATENT DOCUMENTS

| | | | | |
|---|---|---|---|---|
| 3,716,222 A | * | 2/1973 | Anderson | 432/133 |
| 3,820,946 A | * | 6/1974 | Miyoshi et al. | 32/121 |
| 4,198,560 A | * | 4/1980 | Dietrich | 219/388 |
| 4,586,898 A | * | 5/1986 | Orbeck | 432/122 |
| 4,648,837 A | * | 3/1987 | Funghini et al. | 432/122 |
| 4,741,695 A | * | 5/1988 | Ushijima | 432/121 |
| 5,334,014 A | * | 8/1994 | Orbeck et al. | 432/121 |
| 6,095,804 A | * | 8/2000 | Ballabene | 432/121 |
| 6,368,049 B1 | | 4/2002 | Osaka et al. | |
| 6,530,780 B2 | * | 3/2003 | Mori et al. | 432/121 |
| 7,645,136 B2 | * | 1/2010 | Arai et al. | 432/122 |
| 2006/0246390 A1 | | 11/2006 | Aoki et al. | |

FOREIGN PATENT DOCUMENTS

| | | |
|---|---|---|
| JP | U-2-108921 | 8/1990 |
| JP | A-2000-294619 | 10/2000 |
| JP | A-2003-176011 | 6/2003 |

(Continued)

OTHER PUBLICATIONS

Japanese Office Action dated Jun. 15, 2010 in Japanese Patent Application No. 2007-097747 (with translation).

*Primary Examiner* — Thor Campbell
(74) *Attorney, Agent, or Firm* — Oliff & Berridge, PLC (57) ABSTRACT

A walking beam type heat treatment apparatus including a heating furnace having a heating body to heat a substrate by radiation, a pair of first beams that are rod-like and provided in the heating furnace and a second beam disposed between the pair of the first beams, one of the pair of the first beams and the second beam relatively moving alternately in longitudinal and vertical directions repeatedly to the other of the pair of the first beams and the second beam, to cause to deliver and receive the substrate between the pair of the first beams and the second beam, and accordingly, to convey the substrate through the heating furnace, includes a side edge support protrusion that protrudes from each of the pair of the first beams such that the side edge support protrusion can horizontally support the substrate in abutting contact with a side edge of the substrate; and a front edge support protrusion and a rear edge support protrusion that protrude from the second beam such that the front edge support protrusion and the rear edge support protrusion can horizontally support the substrate in abutting contact with a front edge and a rear edge of the substrate.

9 Claims, 5 Drawing Sheets

FOREIGN PATENT DOCUMENTS

| | | |
|---|---|---|
| JP | A-2003-261222 | 9/2003 |
| JP | A-2004-018122 | 1/2004 |
| JP | A-2004-286426 | 10/2004 |
| JP | A-2004-286434 | 10/2004 |
| JP | A-2006-206299 | 8/2006 |
| JP | A-2006-222401 | 8/2006 |
| JP | A-2006-273570 | 10/2006 |
| JP | A-2008-254854 | 10/2008 |

* cited by examiner

| ANGLE θ OF SIDE EDGE SUPPORT PROTRUSION | SCRATCHES ON SUBSTRATE SURFACE | SUBSTRATE SLID | CRACKS OR CHIPPAGES OF SUBSTRATE | DEFICIENCY OF SUBSTRATE IN ELECTRIC PERFORMANCE | REMARKS |
|---|---|---|---|---|---|
| 3 DEGREES | YES | NO | NO | NO | CAMBERED SUBSTRATE IS IN CONTACT WITH LOCKING PIN BECAUSE ANGLE OF SUPPORT PROTRUSION IS APPROXIMATE TO HORIZONTAL LINE. |
| 10 DEGREES | NO | NO | NO | NO | |
| 11.3 DEGREES | NO | NO | NO | NO | |
| 20 DEGREES | NO | NO | NO | NO | |
| 25 DEGREES | NO | NO | NO | SLIGHT | SOMETIMES SUBSTRATE IS SLANTLY CONVEYED. REDUCTION IN ELECTRIC PERFORMANCE OCCURS BY MALDISTRIBUTION OF THERMAL EFFECT DUE TO VARIOUS DISTANCES FROM HEATER TO EACH PORTION OF SUBSTRATE. |

WALKING BEAM TYPE HEAT TREATMENT APPARATUS

This application is based on Japanese Patent Application No. 2007-097747, the contents of which are incorporated hereinto by reference.

BACKGROUND OF THE INVENTION

1. Field of the Invention

The present invention relates to a walking beam type heat treatment apparatus configured to heat-treat a substrate such as a semiconductor substrate and a ceramics substrate.

2. Description of Related Art

There is known a heat treatment apparatus having a walking beam type substrate conveying device to convey using a walking beam in a heat treatment furnace configured to heat-treat a substrate such as semiconductor and ceramics ones. In such a heat treatment apparatus, the substrate is conveyed in the heat treatment furnace for drying or burning, and the heat treatment such as to form a layer by hardening a material on a surface (upper surface) and/or a back surface (lower surface) of the substrate is performed. For instance, JP 2003-176011 and JP 2004-18122 disclose such an apparatus.

The aforementioned heat treatment apparatus having the walking beam type substrate conveying device usually includes a first beam and a second beam that repeatedly alternate relative motions in the longitudinal and vertical directions of a heating furnace, a plurality of support pins respectively protruding upward from the first beam and second beam to support the substrate in contact with it. The substrate supported by the support pin on the lower surface is conveyed by delivering and receiving between the first and second beams.

The walking beam type heat treatment apparatus may require burning treatment to harden a material and form a layer on the upper surface and/or lower surface. For instance, on a solar cell substrate, a comb electrode material such as a thick layer material applied on the whole surface of one of the upper or lower surface in a predetermined pattern by printing, and a lower layer electrode material such as the similar thick layer material applied on the whole surface of the other of the upper or lower surface are burnt, to form the comb electrode and the lower layer electrode on one and the other of the upper and lower surfaces of the substrate.

Figure 9:
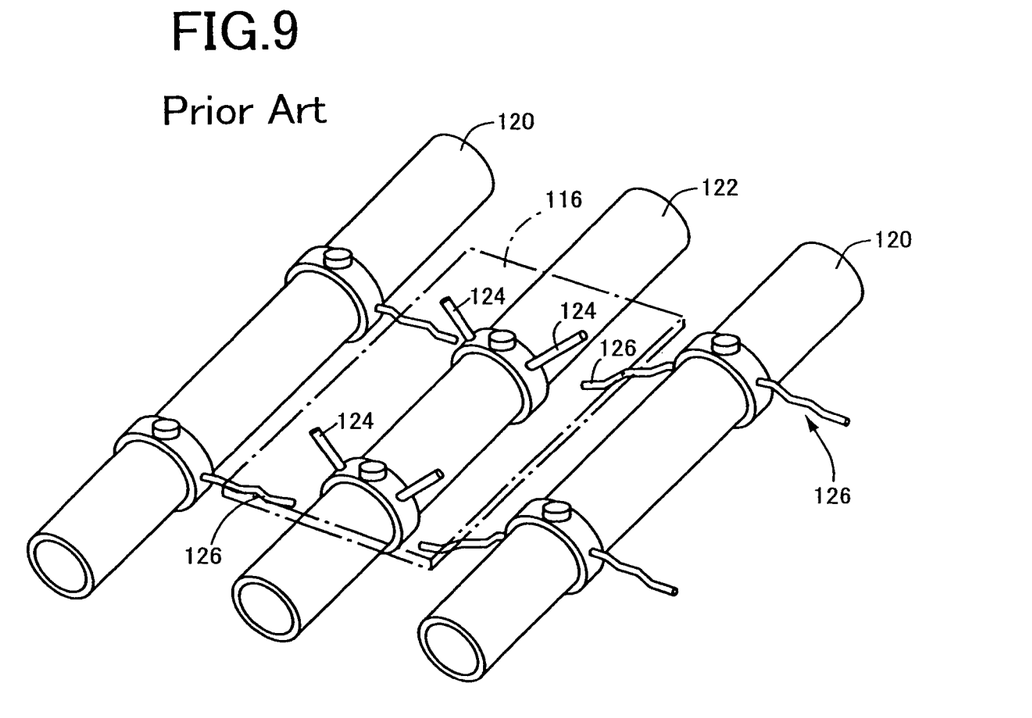
FIG. 9 illustrates essentials of a conveying device including the conventional support pin protruding from the movable beam, in a perspective view.

However, in the conventional walking beam type heat treatment apparatus, for instance, in FIG. 9 a substrate 116 is supported by a support pin 126 of a first beam 120 and a plurality of support pins 124 respectively protruding upward from a second beam 122, the lower surface of the substrate 116 being in abutting contact with the support pins 124, 126. The substrate 116 is conveyed such that it delivered from the support pin 126 of the first beam 120 to the support pin 124 of the second beam 122. Accordingly, the applied layer of the lower surface of the substrate 116 is disadvantageously damaged mechanically upon burning because the material applied on the whole surface of the lower surface of the substrate 116 is contacted by the support pin 124.

It is therefore an object of the present invention to provide a walking beam type heat treatment apparatus in which the applied layer of the lower surface of the substrate is not contacted with the support pin.

SUMMARY OF THE INVENTION

The object indicated above may be achieved according to a first mode of the invention, which provides a walking beam type heat treatment apparatus including a heating furnace having a heating body to heat a substrate by radiation, a pair of first beams that are rod-like and provided in the heating furnace and a second beam disposed between the pair of the first beams, one of the pair of the first beams and the second beam relatively moving alternately in longitudinal and vertical directions repeatedly to the other of the pair of the first beams and the second beam, to cause to deliver and receive the substrate between the pair of the first beams and the second beam, and accordingly, to convey the substrate through the heating furnace, including (a) a side edge support protrusion that protrudes from each of the pair of the first beams such that the side edge support protrusion can horizontally support the substrate in abutting contact with a side edge of the substrate, (b) a front edge support protrusion and a rear edge support protrusion that protrude from the second beam such that the front edge support protrusion and the rear edge support protrusion can horizontally support the substrate in abutting contact with a front edge a rear edge of the substrate.

The object indicated above may be achieved according to a second mode of the invention, which provides the walking beam type heat treatment apparatus of the first mode, wherein the front edge support protrusion and the rear edge support protrusion protrude slantly upward such that the front edge support protrusion and the rear edge support protrusion are in abutting contact with lower ridge lines of the front edge and the rear edge of the substrate, respectively.

The object indicated above may be achieved according to a third mode of the invention, which provides the walking beam type heat treatment apparatus of the first or second mode, wherein the front edge support protrusion and the rear edge support protrusion are provided with a plurality of concaves and convexes engaging with lower ridge lines of the front edge and the rear edge of the substrate, in a portion that the front edge support protrusion and the rear edge support protrusion are in abutting contact with the lower ridge lines of the front edge and the rear edge of the substrate.

The object indicated above may be achieved according to a fourth mode of the invention, which provides the walking beam type heat treatment apparatus of any one of the first to third modes, wherein the side edge support protrusion protrudes from each of the pair of the first beams slantly downward and toward the other of the pair of the first beams such that the side edge support protrusion is in abutting contact with a lower ridge line of the side edge of the substrate.

The object indicated above may be achieved according to a fifth mode of the invention, which provides the walking beam type heat treatment apparatus of any one of the first to fourth modes, wherein the side edge support protrusion is provided with a gently-inclined portion to support the substrate at a lower ridge line of the side edge of the substrate, and a steeply-inclined portion having a steeper inclination than the gently-inclined portion adjoining to the gently-inclined portion to restrain the substrate from slipping from a predetermined position.

The object indicated above may be achieved according to a sixth mode of the invention, which provides the walking beam type heat treatment apparatus of any one of the first to fifth modes, (a) wherein the pair of the first beams and the second beam are made of a tubular transparent ceramics, (b) wherein the front edge support protrusion and the rear edge support protrusion, and the side edge support protrusion are respectively fixed to a plurality of annular fixed members fixed on an outer circumferential side of the first beam and movable beam, and (c) wherein the first beam or the second beam and the annular fixed member is mutually fixed by inserting a locking pin through the first beam or the second beam and the annular fixed member with a predetermined play.

The object indicated above may be achieved according to a seventh mode of the invention, which provides the walking beam type heat treatment apparatus of any one of the first to third modes, wherein the side edge support protrusion protrudes slantly upward such that the side edge support protrusion is in abutting contact with a lower ridge line of the side edge of the substrate.

According to the first mode of the walking beam type heat treatment apparatus, (a) a side edge support protrusion that protrudes from each of the pair of the first beams such that the side edge support protrusion can horizontally support the substrate in abutting contact with a side edge of the substrate, (b) a front edge support protrusion and a rear edge support protrusion that protrude from the second beam such that the front edge support protrusion and the rear edge support protrusion can horizontally support the substrate in abutting contact with a front edge and a rear edge of the substrate. Consequently, since the substrate is supported by the pair of the first beams by the abutting contact of the side edge support protrusion with the side edge, and is supported by the second beam by the abutting contact of the front and rear edge support protrusions with the front edge and the rear edge, the substrate is conveyed without any abutting contact of a member with its lower surface. Accordingly, any mechanical damage on the applied layer of the lower surface of the substrate is preferably prevented.

According to the second mode of the walking beam type heat treatment apparatus, the front edge support protrusion and the rear edge support protrusion protrude slantly upward respectively such that the front edge support protrusion and the rear edge support protrusion are in abutting contact with lower ridge lines of the front edge and the rear edge of the substrate. Consequently, since the substrate is supported by the second beam by the abutting contact of the front and rear edge support protrusions with the front edge and the rear edge, the substrate is conveyed without any abutting contact of a member with its lower surface when the substrate is supported by the second beam.

According to the third mode of the walking beam type heat treatment apparatus, the front edge support protrusion and the rear edge support protrusion are provided with a plurality of concaves and convexes engaging with lower ridge lines of the front edge and the rear edge of the substrate, in a portion that the front edge support protrusion and the rear edge support protrusion are in abutting contact with the lower ridge lines of the front edge and the rear edge of the substrate. Consequently, even if vibrations or a change in acceleration occurs when the substrate is conveyed with being supported by the second beam, any slippage of the substrate from the front and rear edge support protrusions hardly follows and, accordingly, falling of the substrate from the second beam is preferably prevented.

According to the fourth mode of the walking beam type heat treatment apparatus, the side edge support protrusion protrudes from each of the pair of the first beams slantly downward and toward the other of the pair of the first beams such that the side edge support protrusion is in abutting contact with a lower ridge line of the side edge of the substrate. Consequently, since the substrate receives direction components due to its load in the directions of which the lower ridge lines of both of the side edges mutually approach, the substrate is stably supported by the first beam irrespective of such as generation of vibration.

According to the fifth mode of the walking beam type heat treatment apparatus, the side edge support protrusion is provided with a gently-inclined portion to support the substrate at a lower ridge line of the side edge of the substrate, and a steeply-inclined portion having a steeper inclination than the gently-inclined portion adjoining to the gently-inclined portion to restrain the substrate from slipping from a predetermined position. Consequently, since both of the side edges of the substrate is in abutting contact with the steeply-inclined portion even if the substrate is moved by such as vibrations, further slippage is advantageously prevented.

According to the sixth mode of the walking beam type heat treatment apparatus, (a) the pair of the first beams and the second beam are made of a tubular transparent ceramics, (b) the front edge support protrusion, the rear edge support protrusion, and the side edge support protrusion are respectively fixed to a plurality of annular fixed members fixed on an outer circumferential side of the first beam and second beam, and (c) the first beam or the second beam and the fixed member is mutually fixed by inserting a locking pin through the first beam or the second beam and the fixed member with a predetermined play. Consequently, damages by thermal expansion are preferably prevented even if the difference between the thermal expansion of the first beams and second beam and the fixed members fixed to them. Since radiation energy from the heating body can reach the lower surface of the substrate through the transparent ceramics, it facilitates horizontally rapid heating comparing to the conventional walking beam type heat treatment apparatus, and, accordingly, the start-up time and heat treatment time can be reduced and, then, the effect by heat treatment on the characteristics of the substrate can be possibly reduced.

According to the seventh mode of the walking beam type heat treatment apparatus, the side edge support protrusion protrudes slantly upward such that the side edge support protrusion is in abutting contact with a lower ridge line of the side edge of the substrate. Consequently, since the substrate receives a thrust of direction components due to its load in the directions of which the lower ridge lines of both of the side edges mutually approach, the substrate is stably supported by the first beam irrespective of such as generation of vibration.

Preferably, the tubular transparent ceramics constituting the first beam and second beam is constituted of a transparent silica tube made of silica glass. Consequently, it is advantageously provided a further lighter and superiorly rigid tubular member at a low cost. Here, the word "transparent" means that it has a transmittance such that radiation energy from a heating body can permeate the transparent ceramics, reach the lower surface of the substrate and contribute to even and rapid heating of the substrate. For instance, in use of a heating body radiating near infrared rays, since it means transparency such that the near infrared rays can reach the lower surface of the substrate and contribute to even and rapid heating of the substrate, it is no problem if the tubular member is slightly opaque for permeation of visible light that has another frequencies than those contributing to heating. It is determined such that a radiation frequency from the heating body to heat the substrate by radiation is a standard.

The aforementioned "transparent ceramics" is non-metal inorganic solid material made by heat treatment, and includes silicate mineral, heat-resistant glass such as alumina made from various metal oxides or non-oxides, new ceramics such as titania, crystallized silica slightly opaque for visible light, and silica transparent for visible light. The preferable transparent ceramics is an oxide that permeate frequencies ranging from near infrared rays to visible light of 5 μm or below, preferably 4 μm or below, further preferably 3 μm or below, and, preferably, permeate 50% or more, preferably 70% or more, in the usual distinction, an oxide that is comparatively transparent in the range of visible light, having transparency characteristics of, for instance, 60% or over, further preferably 80% or over. The preferable material is one having deflective strength of 300 kg/cm$^2$ or more at 800° C., for example, transparent dissolved silica glass, high silica glass including 95% or over SiO$_2$ such as "Vycor® glass" No. 7900 or No. 7940 of Corning Incorporated, or transparent alumina, or may be transparent dissolved silica that is preferably easy to obtain and superior in surface roughness.

Preferably, the first beam is a fixed beam fixedly disposed with respect to the heating furnace, and the second beam is a movable beam that is capable of relative motion with respect to the heating furnace, and, accordingly, it can be provided the walking beam type heat treatment apparatus with a simple-structure beam drive mechanism.

Preferably, the first beam and second beam of the walking beam type heat treatment apparatus may be a set of a fixed beam and a movable beam, or movable beams both. The walking beam type heat treatment apparatus having the movable first and second beams may be advantageous to restrain the motion at the upper vertical limit if the first and second beams have the same upper vertical limits of the moving stroke in the vertical direction and the substrate is delivered at the upper vertical limit.

Preferably, the tubular member constituting the first beam and/or the second beam may have not only a shape of a circle in its sectional view but an ellipse, or a polygon such as a triangle, a quadrangle or a rectangle, or an inverted T-shaped one. The first beam and/or the second beam may be a hollow tubular member or a solid-core rod-like member.

Preferably, a portion of the first beam and/or the second beam or the tubular member is that heated by radiation to be at relatively high temperature in the heating furnace within the total length, or that heat-treated at a predetermined temperature or over by radiation heating due to radiation energy in the heating furnace. It is sufficient that, for instance, a portion heated by radiation to be at a relatively high temperature in the heating furnace within the total length of one or both of the first beam and second beam, may be made of the transparent ceramics. Only one of the first beam and second beam made of the transparent ceramics is available in a degree.

Preferably, the heating furnace is provided with a plurality of near infrared radiating bodies as heating bodies disposed apart from the upper and lower surfaces of the substrate to be conveyed in a predetermined distance. Accordingly, the upper and lower surfaces of the substrate are horizontally heated because near infrared rays radiated from the near infrared radiating body permeates the transparent ceramics. And rapid heating of the substrate is achieved because near infrared radiation energy from the near infrared radiating body can reach the lower surface of the substrate through the transparent ceramics. The heating body to heat the substrate by radiation may be not only a radiator of near infrared rays but that radiating a radiation having a frequency capable of heating by radiation such as far infrared rays or visible light.

Preferably, the halogen heater mainly radiating near infrared rays is preferably used as the heating body, and another heating body radiating a radiation of a frequency including it or another frequency such as far infrared rays or visible light may be available.

Preferably, the heating furnace is provided with a plurality of heating chambers separated by a bulkhead that is disposed as protruding downward from the ceiling of the heating chamber, and an exhaust pipe connected to a portion constituting the ceiling of the heating chamber. This restrains residence of the exhaust gas generated from the layer material applied on the surface of the substrate, between the near infrared radiating body and the substrate, and, accordingly, the heating efficiency is enhanced.

Preferably, the furnace wall of the furnace body is made of a ceramic fiber board that is manufactured by solidifying ceramic fibers and forming the solidified ceramic fibers into a thick-platelike block shape. At least the inner surface of the ceramic fiber board is coated with silica-based material. Accordingly, this provides superiority in cleanness due to prevention from generation of dust from the ceramic fiber board.

Preferably, the front edge support protrusion and the rear edge support protrusion are made of metal rods having a circle shape in the sectional view. The plurality of concaves and convexes are constituted of threads formed on the outer circumferential surface of the metal rod by a thread cutting die. This causes exceedingly easily forming many concaves and convexes.

Preferably, the front edge support protrusions are made of two bars or wires that slantly protrudes forward with extending upward such that a distance between the front edge support protrusions increases with extending apart from the second beam. Preferably, the rear edge support protrusions are made of two bars or wires that slantly protrudes backward with extending upward such that a distance between the rear edge support protrusions increases with extending apart from the second beam. At least three front and rear edge support protrusions in total can support the substrate. Thus, the front edge support protrusions and rear edge support protrusions are formed to slantly protrude with extending upward such that a distance between the support protrusions increases with extending upward. Consequently, since the substrate supported by them receives a thrust of direction components due to its load in the directions of which the lower ridge lines of the front and rear edges mutually approach, the substrate is stably supported by the second beam irrespective of such as generation of vibration. Three support protrusions including one front or rear edge support protrusions and two of the other support protrusions can support the substrate to preferably prevent unstableness. Three or more front edge support protrusions may be provided and, as well, three or more rear edge support protrusions may be provided, respectively.

Preferably, three side edge support protrusion's protruding from each of the pair of the first beams toward the counterpart, can support the substrate, including one side edge support protrusion from one of the pair of the first beams and two side edge support protrusions from the other of the pair of the first beams. Three or more side edge support protrusions may be provided, respectively. The side edge support protrusion is made of a metal bar or wire by bending forming, to have a plurality of sets of the gently-inclined portion and steeply-inclined portion, the set being repeated and the side edge support protrusion appearing multistep. This causes an advantage to convey a plurality of sorts of the substrates having various dimensions in width.

Preferably, the substrate may have at least a front edge and a rear edge that can be supported by the front edge support protrusion and the rear edge support protrusion, and a pair of side edges that can be supported by the side edge support protrusions, and may have a shape of a square or a rectangle, furthermore, for instance, or another shape of a polygon constituted of straight lines or curves and of which the angle between the front or rear edge and the side edge is not a right angle, such as an octagon, or such as a circle.

DETAILED DESCRIPTION OF EXEMPLARY EMBODIMENTS

Hereinafter, there will be described the present invention by reference to the drawings. The figures are appropriately simplified or transformed, and all the proportion of the dimension and the shape of a portion or member may not be reflective of the real one in the following embodiments.

Embodiment 1

Figure 1:
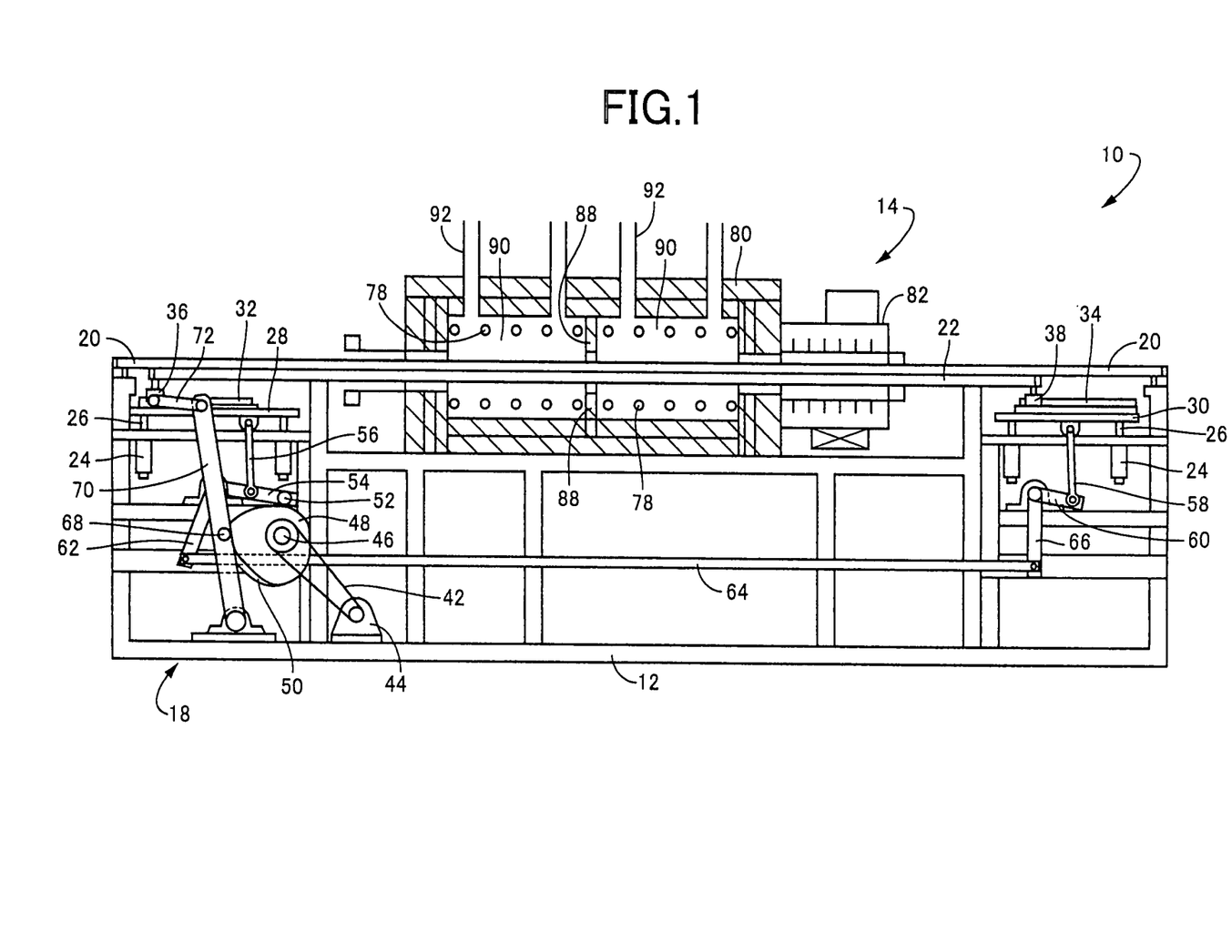
FIG. 1 illustrates a walking beam type heat treatment apparatus according to an embodiment of the present invention in a side and sectional view, to explain its structure.

FIG. 1 illustrates an embodiment of a walking beam type heat treatment apparatus 10 according to the present invention in a side view. The walking beam type heat treatment apparatus 10 is provided with a heating furnace 14 and a conveying device 18. The heating furnace 14 is formed such that its shape is like a tunnel and fixed at a predetermined height by a frame (apparatus frame) 12. The conveying device 18 is configured to sequentially convey substrates 16 through the heating furnace 14 from an entrance to an exit of the heating furnace 14. The substrate 16 substantially has a rectangular shape such as a square having its length of an edge ranging from 200 mm to 250 mm. The substrate 16 may, for instance, be a semiconductor substrate such as a monocrystalline or polycrystalline silicon wafer to form a solar cell, a substrate formed of a glass substrate and a semiconductor layer made of such as silicon formed on it, or a substrate formed of a monocrystalline substrate of such as sapphire and a laminated semiconductor layer made on it by a crystal growth technique. The substrate 16 is rapidly heat-treated, for instance, to burn and fix a thick layer material such as a material paste for an electrode, printed on a front and back surface of the substrate 16 by a heat treatment, to be an electrode layer.

The conveying device 18 is provided with a plurality of fixed beams 20, that is, first beams having their shapes like beams supported by the frame 12 at their both ends, and a plurality of movable beams 22, that is, second beams. One of the fixed and movable beams 20, 22 relatively moves alternately in longitudinal and vertical directions of the heating furnace 14 repeatedly to the other of the fixed and movable beams 20, 22, that is, the movable beam 22 moves repeatedly upward, forward, downward and backward relative to the fixed beam 20, causes to deliver and receive the substrate 16 between the fixed and movable beams 20, 22, and accordingly, to convey the substrate 16 toward the exit of the heating furnace 14.

The fixed and movable beams 20, 22 are formed of a transparent silica tube over the whole lengths, to permit radiation for heating a bottom surface of the substrate 16 to permeate the beams 20, 22. Another structure of the fixed and movable beams 20, 22 having the transparent silica tube in necessary portions for heating the substrate 16 by radiation and metal tube material such as stainless steel in the remainder portions may be available. That is, portions of the fixed and movable beams 20, 22 in the longitudinal direction, for instance, portions to be heated by radiation in the heating furnace 14, for instance, only portions to be disposed within the furnace 14 and heated by radiation at 400° C. or over, may be the transparent silica tube.

The conveying device 18 is provided with an entrance side elevating plate 28, an exit side elevating plate 30, an entrance side movable member 36, an exit side movable member 38, a vertical feed cam 48, a lengthwise feed cam 50, an entrance side vertical lever 54, a connecting link bar 56, an exit side vertical lever 60, a first link bar 62, a second link bar 64, a third link bar 66, a lengthwise lever 70 and a link bar 72. The entrance side elevating plate 28 and the exit side elevating plate 30 are capable of respectively elevating by a plurality of ("four" in this embodiment) guide rods 26 that are vertically guided along a plurality of ("four" in this embodiment) guide bushings 24 that are fixed to the frame 12, on the entrance side and the exit side of the heating furnace 14. The entrance side movable member 36 and the exit side movable member 38 are respectively guided by an entrance side guide rail 32 and an exit side guide rail 34 in a longitudinal direction of the heating furnace 14, that is, in a conveying direction of the substrate 16 (longitudinal direction of the furnace), the guide rails 32, 34 being respectively disposed on the entrance side elevating plate 28 and the exit side elevating plate 30, and the movable members 36, 38 respectively support end portions of the movable beam 22. The vertical feed cam 48 and the lengthwise feed cam 50 are fixed to a cam shaft 46 that is rotatably driven by a motor 44 with a speed reducer, through a looped driving belt 42 such as a timing belt or a chain. The entrance side vertical lever 54 is reciprocatingly turned along a cam curve of the vertical feed cam 48 and a cam follower 52 is fixed to the entrance side vertical lever 54, the cam follower 52 being in contact with a cam surface, that is, an outer circumferential surface of the vertical feed cam 48. The connecting link bar 56 connects the entrance side vertical lever 54 and entrance side elevating plate 28 in order to transmit vertical motion of the entrance side vertical lever 54. The exit side vertical lever 60 is connected to the exit side elevating plate 30 through a link bar 58. The first link bar 62, the second link bar 64 and the third link bar 66 connect a rotating shaft of the entrance side vertical lever 54 and a rotating shaft of the exit side vertical lever 60 in order to transmit rotating motion of the entrance side vertical lever 54 to the exit side vertical lever 60. The lengthwise lever 70 is reciprocatingly turned along a cam curve of the lengthwise feed cam 50 and a cam follower 68 is fixed to the lengthwise lever 70, the cam follower 68 being in contact with a cam surface, that is, an outer circumferential surface of the lengthwise feed cam 50. The link bar 72 connects the lengthwise lever 70 and entrance side movable member 36 in order to transmit lengthwise motion of the lengthwise lever 70.

In the conveying device 18, there are fewer members between the motor 44 with the speed reducer and the cam shaft 46 as possible, and there is only one member, that is, the looped driving belt 42 in this embodiment; the end portions of the movable beam 22 on the entrance and the exit sides are supported by the entrance side elevating plate 28 and the exit side elevating plate 30 such that the substrate 16 can be conveyed in the longitudinal direction; the first link bar 62 that is turnable along with the entrance side vertical lever 54 in order to drive the exit side vertical lever 60 and the third link bar 66 that is turnable along with the exit side vertical lever 60 are connected by the longitudinally-shaped second link bar 64 that is longer than the overall length of a furnace body 80, and, accordingly, turning motion is wholly transmitted from the entrance side vertical lever 54 to the exit side vertical lever 60; and the entrance side vertical lever 54 is directly turned by the vertical feed cam 48. Consequently, chattering and vibration of the movable beam 22 are preferably prevented, in comparison with use of a gear box and a shaft of which the rotating direction is converted by the gear box, for transmitting the drive force to the exit side.

In this embodiment, a plurality of pairs of the fixed beams 20 are provided, two fixed beams 20 that are mutually parallel constituting one pair of the fixed beams 20 and their end portions being supported by the frame 12, and the movable beam 22 is disposed between the pair of the fixed beams 20 in parallel, its end portions being supported by the entrance side movable member 36 and the exit side movable member 38, respectively, in order to cooperate to convey the substrate 16.

In FIG. 1 the heating furnace 14 is provided with the furnace body 80 to form a heating space having a lengthwise rectangular parallelepipedonal shape, the heating space being closed except the entrance and exit, and a tunnellike cooling device 82 connected to the exit side of the furnace body 80, in order to rapidly cool the substrate 16 successively carried out of the furnace body 80 through its exit. The heating furnace 14 is configured to heat-treat at a temperature ranging from about 700° C. to about 900° C. and for about one minute.

As shown in FIG. 1 in a longitudinally sectional view in detail, the furnace body 80 is provided with a lengthwise halogen heater 78 that is a rod-like heating body and that emits near infrared rays having a wavelength ranging from about 1.80 μm to about 1.31 μm, and a plurality of the halogen heaters 78 are perpendicularly disposed to the conveying direction in a row and vertically spaced by a predetermined distance with respect to the substrate 16. The substrate 16 is conveyed by the movable beam 22 and the fixed beam 20 in a space vertically interposed by the plurality of the halogen heaters 78, and heated by the near infrared rays emitted from the plurality of the halogen heaters 78 onto an upper and lower surface of the substrate 16 in this conveying step such that the substrate 16 is heated. In the furnace body 80, since the movable beam 22 and the fixed beam 20 are made of transparent silica tubes, the near infrared rays that is transmitted from the halogen heater 78 disposed on the bottom side to the lower surface of the substrate 16 is not shielded by the movable beam 22 and the fixed beam 20, and reaches the lower surface of the substrate 16 through the transparent silica tube constituting them, and, consequently, thus it causes rapid and even heating.

A furnace wall of the furnace body 80 is made of a ceramic fiber board that is thermal insulating and light in weight, the ceramic fiber board being manufactured by solidifying ceramic fibers, for instance, by impregnating silica gel and forming the solidified ceramic fibers into a thick-platelike block shape. At least an inner surface of the ceramic fiber board is coated with silica-based material. Accordingly, this provides thermal insulation and superiority in cleanness due to prevention from generation of dust from the ceramic fiber board.

A preheating pipe (not shown) is disposed between the halogen heater 78 lower than a conveying path of the substrate 16 and a lower furnace wall, and an air supply pipe serially connected to the preheating pipe is disposed between the halogen heater 78 upper than the conveying path of the substrate 16 and an upper furnace wall. There are provided a plurality of exhaust nozzles in the air supply pipe. Through the plurality of exhaust nozzles, gas that is preheated in the preheating pipe is supplied into a heating space of the furnace body 80. The supplied gas in this embodiment is air because it is in an oxidizing atmosphere in this embodiment. However, inert gas such as nitrogen is preferable for an embodiment of non-oxidizing atmosphere, and hydrogen gas is preferable for an embodiment of reducing atmosphere.

As shown in FIG. 1, the heating space in the furnace body 80 of the heating furnace 14 is provided with a plurality of heating chambers 90 (two heating chambers 90 in this embodiment) separated by a bulkhead 88 that is disposed as protruding downward from the ceiling and upward from the bottom, and an exhaust pipe 92 connected to a portion constituting the ceiling of the heating chamber 90. When a component in layer material applied on upper and lower surfaces of the substrate 16 is burnt in the furnace body 80 in heating treatment, combustion gas is rapidly exhausted from the inside of each of the heating chambers 90 through the exhaust pipe 92, together with the preheated air supplied from the exhaust nozzle of the air supply pipe.

Figure 2:
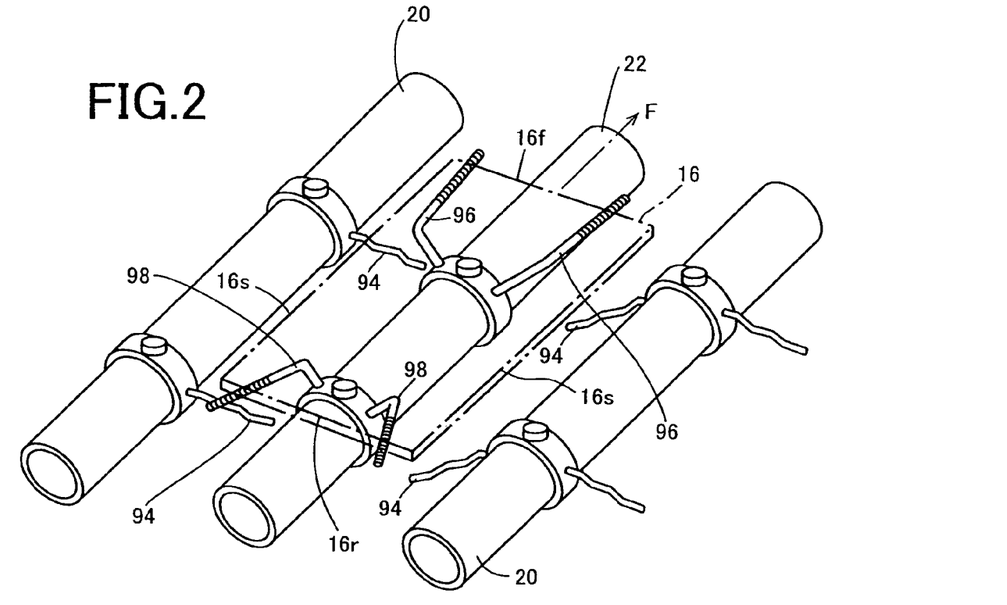
FIG. 2 illustrates essentials in a perspective view, to explain the relationship between the fixed beam and movable beam, and substrate conveyed by them in the embodiment of FIG. 1.

FIG. 2 illustrates a pair of the fixed beams 20 and the movable beam 22 disposed between the pair of the fixed beams 20 in a perspective view. The distance between central axes of the pair of the fixed beams 20 is determined to be larger than the traverse dimension (edge) of the substrate 16. The fixed beam 20 is provided with a plurality of pairs of side edge support protrusions 94 that protrude toward the counterpart of the fixed beam 20 from the pair of the fixed beams 20 such that the plurality of pairs of side edge support protrusions 94 can horizontally support the substrate 16 in abutting contact with side edges 16s of the substrate 16. The movable beam 22 is provided with a pair of front edge support protrusions 96 and a pair of rear edge support protrusions 98 that protrude slantly upward from the second beam such that the pairs of front and rear edge support protrusions 96, 98 can horizontally support the substrate 16 in abutting contact with front and rear edges 16f, 16r of the substrate 16, respectively.

Figure 4:
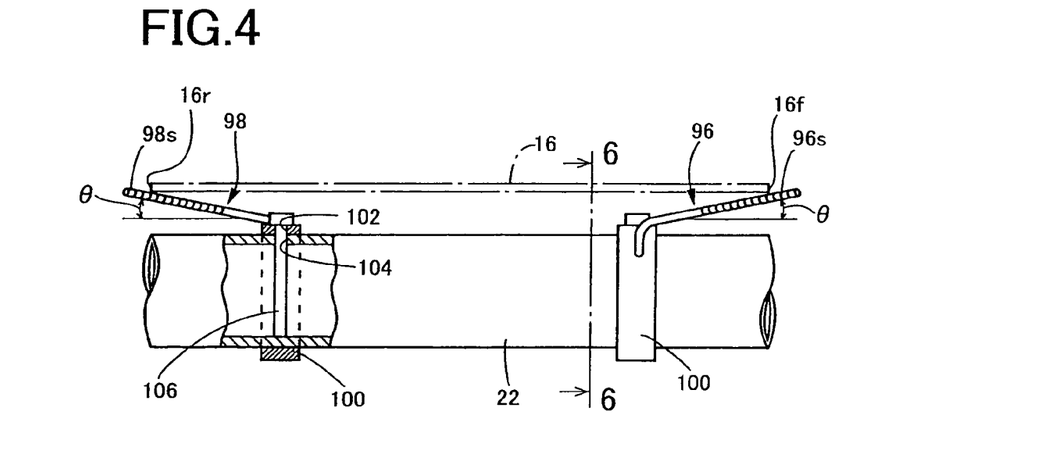
FIG. 4 illustrates essentials of the movable beam in a side view, to explain the structure of the movable beam of FIG. 1 and the front edge support protrusion and the rear edge support protrusion fixed to it.

The side edge support protrusion 94 and the front edge support protrusions 96 and rear edge support protrusions 98 are made of a metal bar or wire having a comparatively small diameter by bending forming, and they are fixed by welding to an annular (or short tubular) fixed member 100 made of metal fixed on an outer circumferential side of the fixed beam 20 and movable beam 22. The side, front and rear edge support protrusions 94, 96, 98 and the fixed member 100 are made of, for instance, well-known heat-resistant steel such as stainless steel. For instance, as shown in FIG. 4, the annular fixed member 100 is provided with a pair of through-holes 102 and the fixed and movable beams 20, 22 are provided with a pair of through-holes 104 in their counterpart positions. The annular fixed member 100 is fixed on the predetermined position of each of the fixed and movable beams 20, 22 by inserting a locking pin 106 through the through-holes 102, 104 with a predetermined play. That is, the side edge support protrusion 94 is fixed to the fixed beam 20 via the fixed member 100 and the front edge support protrusion 96 and rear edge support protrusion 98 are fixed to the movable beam 22 via the fixed member 100.

Figure 3:
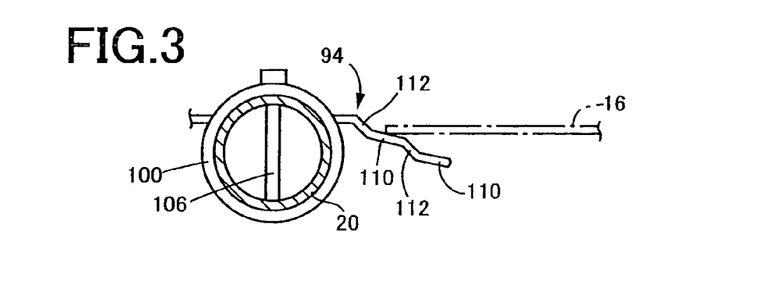
FIG. 3 illustrates the fixed beam in a sectional view, to explain the structure of the fixed beam of FIG. 1 and the side edge support protrusion fixed to it.

The side edge support protrusion 94 protrudes from each of the pair of the fixed beams 20 slantly downward and toward the counterpart such that the side edge support protrusion 94 is in abutting contact with a lower ridge line of each of the pair of side edges 16s of the substrate 16. As shown in FIG. 3 in detail, the side edge support protrusion 94 is provided with a gently-inclined portion 110 in abutting point-contact with the lower ridge line of the side edge 16s of the substrate 16 to support the substrate 16, a steeply-inclined portion 112 having a steeper inclination than the gently-inclined portion 110 adjoining to the gently-inclined portion 110 to restrain the substrate 16 from slipping from a predetermined position. The side edge support protrusion 94 is provided with a plurality of, that is, two sets of the gently-inclined portion 110 and the steeply-inclined portion 112 adjoining to the gently-inclined portion 110 in sequence. The gently-inclined portion 110 in abutting contact with the lower ridge line of the side edge 16s of the substrate 16 to support the substrate 16 is determined to incline having an inclination angle ranging from 10 degrees to 20 degrees from the horizontal line, and the steeply-inclined portion 112 is determined to incline having a sufficiently larger inclination angle ranging from 30 degrees to 80 degrees from the horizontal line, than that of the gently-inclined portion 110.

Figure 5:
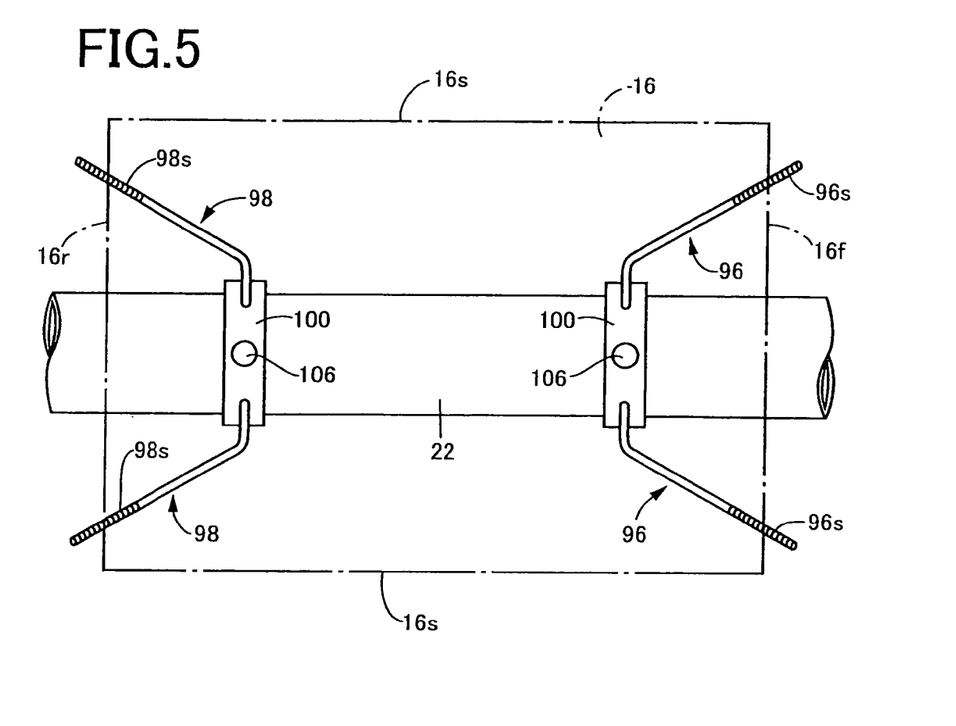
FIG. 5 illustrates essentials of the movable beam in a plan view, to explain the structure of the movable beam of FIG. 1 and the front edge support protrusion and the rear edge support protrusion fixed to it.
Figure 6:
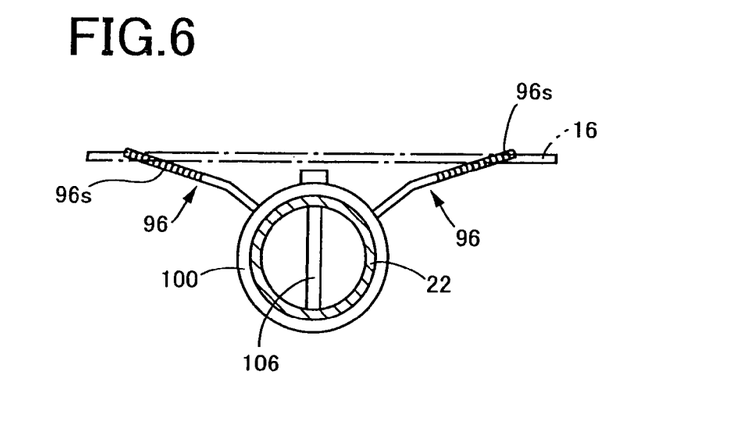
FIG. 6 illustrates the movable beam in a sectional view cut along 6-6 in FIG. 4, to explain the structure of the movable beam of FIG. 1 and the front edge support protrusion and the rear edge support protrusion provided on it.

As shown in FIGS. 4 to 6, the front edge support protrusion 96 and the rear edge support protrusion 98 protrude slantly upward such that the front and rear edge support protrusions 96, 98 can support the substrate 16 in abutting point-contact with the lower ridge lines of the front and rear edges 16f, 16r of the substrate 16, respectively. That is, the front edge support protrusions 96 are made of two bars or wires that slantly protrudes forward F with extending upward such that a distance between the front edge support protrusions 96 increases with extending apart from the movable beam 22. The rear edge support protrusions 98 are made of two bars or wires that slantly protrudes backward with extending upward such that a distance between the rear edge support protrusions 98 increases with extending apart from the movable beam 22. The front and rear edge support protrusions 96, 98 are provided with a plurality of concaves and convexes 96s, 98s in order that the substrate 16 is not slidable on the front and rear edge support protrusions 96, 98 because the lower ridge lines of the front and rear edges 16f, 16r are engaged with the plurality of concaves and convexes 96s, 98s. The plurality of concaves and convexes 96s, 98s are made such that a male thread is formed by a thread die in a predetermined lengthwise range in a portion that the front and rear edge support protrusions 96, 98 are in abutting point-contact with the lower ridge lines of the front and rear edges 16f, 16r of the substrate 16. The inclination angle θ of the front and rear edge support protrusions 96, 98 with regard to the horizontal plane, on the lateral projection plane (the projection view on a vertical plane parallel to the movable beam 22) is determined to range from about 10 degrees to about 20 degrees.

Experiment 1

Figure 7:
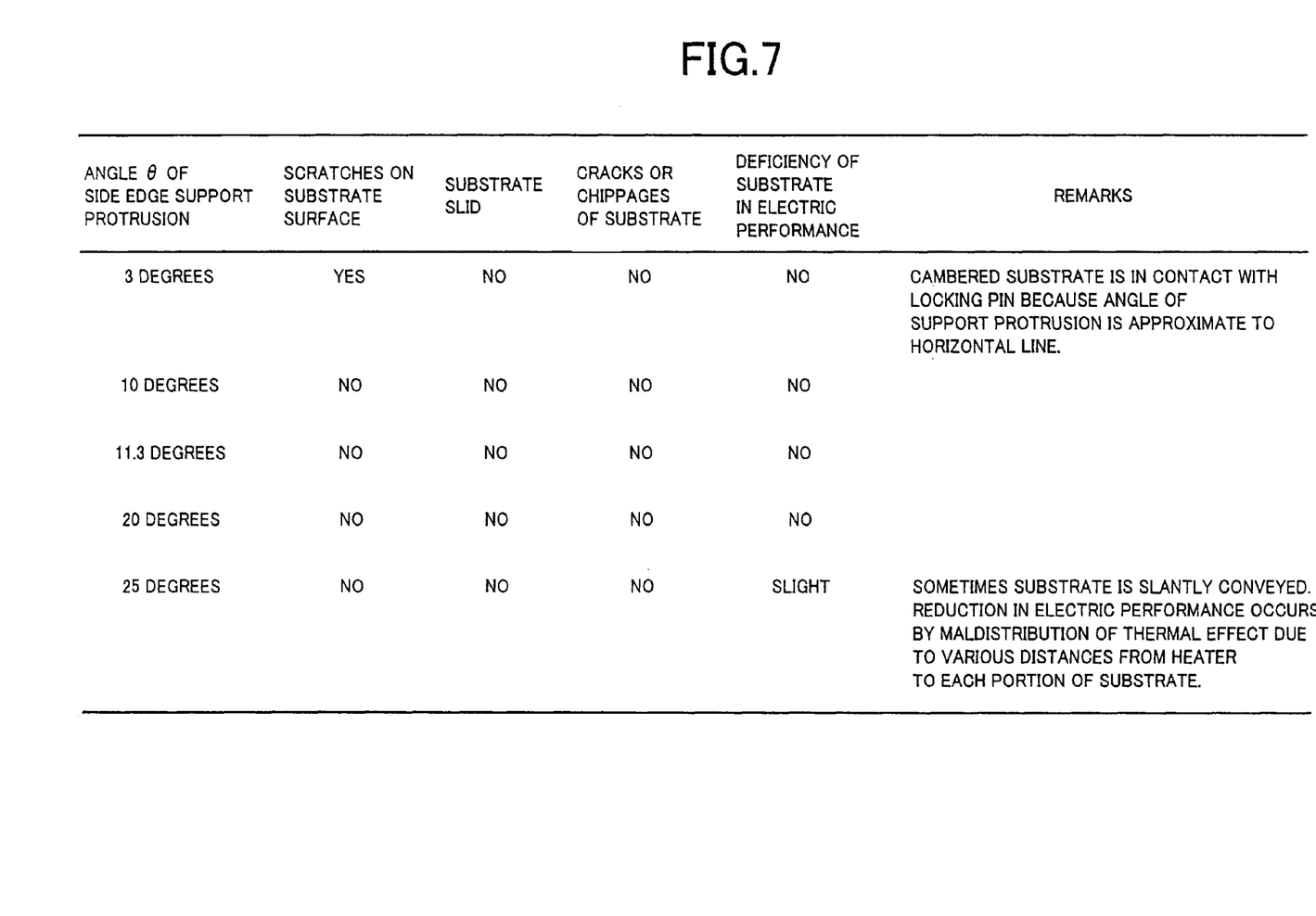
FIG. 7 is a table showing the results of the experiment in which the substrate 16 for the solar cell that is silicon-based and has 0.2 mm in thickness is burnt, the experiment being conducted under the same conditions other than use of five sorts of the front and rear edge support protrusions in FIGS. 4-6 that are different in their inclination angles θ with regard to the horizontal plane, on the lateral projection view.

FIG. 7 shows the results of the experiment in which the substrate 16 for the solar cell that is silicon-based and has 0.2 mm in thickness is burnt. The experiment was conducted under the same conditions other than use of five sorts of the front and rear edge support protrusions 96, 98 that are different in their inclination angles θ. With regard to the range of the inclination angles θ of the front and rear edge support protrusions 96, 98, the experiment was conducted because a camber of the substrate 16 tends to affect the results in the longitudinal direction of the substrate 16.

The table in FIG. 7 shows that no problems arose in the range from 10 degrees to 20 degrees of the inclination angle θ: no scratches were found on the surface of the substrate 16; no slippage from the predetermined position of the substrate 16 was found; no cracks or chippages on the substrate 16 were found; and no deficiency in electric performance for the substrate 16 were found. However, the substrate 16 having the protrusions 96, 98 with the inclination angle θ of three (3) degrees became cambered under being burnt and it caused damages on the lower surface of the substrate 16 in part by contacting of the head of the locking pin 106 or the front and/or rear edge support protrusions 96, 98. The substrate 16 having a comb electrode on its lower surface may come to suffer breaking of line, and the substrate 16 having an electrode on its whole lower surface may come to suffer a change in its color or quality by penetration of another metal component into the aluminum layer constituting the electrode due to contact. On the other hand, the substrate 16 having the protrusions 96, 98 with the inclination angle θ of twenty-five (25) degrees may come to suffer reduction in electric performance by maldistribution of thermal effect due to the inclined substrate 16 under conveyance and, accordingly, due to various distances from the halogen heater 78 to each portion of the substrate 16.

According to the present embodiment of the walking beam type heat treatment apparatus 10, (a) a side edge support protrusion 94 that protrudes from each of the pair of the fixed beams (first beams) 20 such that the side edge support protrusion can horizontally support the substrate 16 in abutting contact with a side edge 16s of the substrate 16, (b) a front edge support protrusion 96 and a rear edge support protrusion 98 that protrude from the movable beam (second beam) 22 such that the front edge support protrusion and the rear edge support protrusion can horizontally support the substrate 16 in abutting contact with a front edge 16f and a rear edge 16r of the substrate 16. Consequently, since the substrate 16 is supported by the pair of the fixed beams 20 by the abutting contact of the side edge support protrusion 94 with the side edge 16s, and is supported by the movable beam 22 by the abutting contact of the front and rear edge support protrusions 96, 98 with the front edge 16f and the rear edge 16r, the substrate 16 is conveyed without any abutting contact of a member with its lower surface. Accordingly, any mechanical damage on the applied layer of the lower surface of the substrate 16 is preferably prevented.

According to the present embodiment of the walking beam type heat treatment apparatus 10, the front edge support protrusion 96 and the rear edge support protrusion 98 protrude slantly upward respectively such that the front edge support protrusion 96 and the rear edge support protrusion 98 are in abutting contact with lower ridge lines of the front edge 16f and the rear edge 16r of the substrate 16. Consequently, since the substrate 16 is supported by the movable beam 22 by the abutting contact of the front and rear edge support protrusions 96, 98 with the front edge 16f and the rear edge 16r, the substrate 16 is conveyed without any abutting contact of a member with its lower surface when the substrate 16 is supported by the movable beam 22.

According to the present embodiment of the walking beam type heat treatment apparatus 10, the front edge support protrusion 96 and the rear edge support protrusion 98 are provided with a plurality of concaves and convexes 96s, 98s engaging with lower ridge lines of the front edge 16f and the rear edge 16r of the substrate 16, in a portion that the front edge support protrusion 96 and the rear edge support protrusion 98 are in abutting contact with the lower ridge lines of the front edge 16f and the rear edge 16r of the substrate 16. Consequently, even if vibrations or a change in acceleration occurs when the substrate 16 is conveyed with being supported by the movable beam 22, any slippage of the substrate 16 from the front and rear edge support protrusions 96, 98 hardly follows and, accordingly, falling of the substrate 16 from the movable beam 22 is preferably prevented.

According to the present embodiment of the walking beam type heat treatment apparatus 10, the side edge support protrusion 94 protrudes from each of the pair of the fixed beams 20 slantly downward and toward the other of the pair of the fixed beams 20 such that the side edge support protrusion 94 is in abutting contact with a lower ridge line of the side edge 16s of the substrate 16. Consequently, since the substrate 16 receives direction components due to its load in the directions of which the lower ridge lines of both of the side edges 16s mutually approach, the substrate 16 is stably supported by the fixed beam 20 irrespective of such as generation of vibration.

According to the present embodiment of the walking beam type heat treatment apparatus 10, the side edge support protrusion 94 is provided with a gently-inclined portion 110 to support the substrate at a lower ridge line of the side edge 16s of the substrate 16, and a steeply-inclined portion 112 having a steeper inclination than the gently-inclined portion 110 adjoining to the gently-inclined portion 110 to restrain the substrate 16 from slipping from a predetermined position. Consequently, since both of the side edges 16s of the substrate 16 is in abutting contact with the steeply-inclined portion 112 even if the substrate 16 is moved by such as vibrations, further slippage is advantageously prevented.

According to the present embodiment of the walking beam type heat treatment apparatus 10, (a) the pair of the fixed beams 20 and the movable beam 22 are made of a tubular transparent ceramics, (b) the front edge support protrusion 96, the rear edge support protrusion 98, and the side edge support protrusion 94 are respectively fixed to a plurality of annular fixed members 100 fixed on an outer circumferential side of the fixed beam 20 and movable beam 22, and (c) the fixed beam 20 or the movable beam 22 and the annular fixed member 100 is mutually fixed by inserting a locking pin 106 through the fixed beam 20 or the movable beam 22 and the annular fixed member 100 with a predetermined play. Consequently, damages by thermal expansion are preferably prevented even if the difference between the thermal expansion of the fixed beams 20 and movable beam 22 and the fixed members 100 fixed to them. Since radiation energy from the heating body can reach the lower surface of the substrate 16 through the transparent ceramics, it facilitates horizontally rapid heating comparing to the conventional walking beam type heat treatment apparatus, and, consequently, the start-up time and heat treatment time can be reduced and, then, the effect by heat treatment on the characteristics of the substrate 16 can be possibly reduced.

According to the present embodiment of the walking beam type heat treatment apparatus 10, the side edge support protrusion 94 protrudes slantly upward such that the side edge support protrusion 94 is in abutting contact with a lower ridge line of the side edge 16s of the substrate 16. Consequently, since the substrate 16 receives a thrust of direction components due to its load in the directions of which the lower ridge lines of both of the side edges 16s mutually approach, the substrate 16 is stably supported by the fixed beam 20 irrespective of such as generation of vibration.

Next, it is described another embodiment of the present invention. In the following description the common portion to both of the present and aforementioned embodiments is given the same reference numerals and the explanation is omitted.

Figure 8:
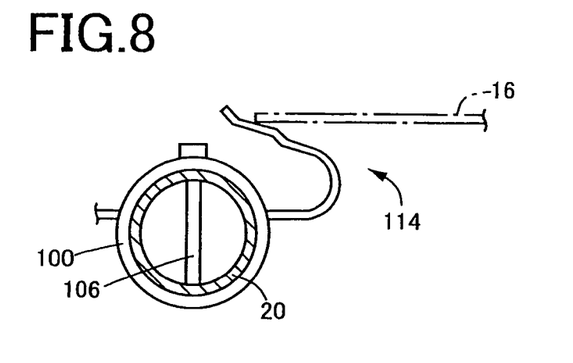
FIG. 8 illustrates the fixed beam in a sectional view, to explain the structure of the fixed beam and the side edge support protrusion fixed to it, according to another embodiment of the present invention, corresponding to FIG. 3.

FIG. 8 illustrates a side edge support protrusion 114 that is provided on the fixed beam 20 of another embodiment of the present invention. The side edge support protrusion 114 of this embodiment horizontally extends from the fixed member 100 and, then, turns upward such that the side edge support protrusion 114 slantly extends upward with approaching the side of the fixed beam 20. As well as the portion described above, in this inclined portion, the side edge support protrusion 114 is provided with a gently-inclined portion 110 to support the lower ridge line of the side edge 16s of the substrate 16 to support the substrate 16, a steeply-inclined portion 112 having a steeper inclination than the gently-inclined portion 110 adjoining to the gently-inclined portion 110 to restrain the substrate 16 from slipping from a predetermined position. According to this embodiment, the same function and effect can be achieved as those in the embodiment of the aforementioned side edge support protrusion 94.

Above described in detail is the present invention with reference to the drawings. It is to be understood that the present invention may be embodied with other changes, improvements, and modifications that may occur to a person skilled in the art without departing from the scope and spirit of the invention defined in the appended claims.

What is claimed is:

1. A walking beam type heat treatment apparatus including a heating furnace having a heating body to heat a substrate by radiation, a pair of first beams that are rod-like and provided in the heating furnace and a second beam disposed between the pair of the first beams, one of the pair of the first beams and the second beam relatively moving alternately in longitudinal and vertical directions repeatedly to the other of the pair of the first beams and the second beam, to cause to deliver and receive the substrate between the pair of the first beams and the second beam, and accordingly, to convey the substrate through the heating furnace, comprising:

a side edge support protrusion that protrudes from each of the pair of the first beams such that the side edge support protrusion can horizontally support the substrate in abutting contact with a side edge of the substrate; and a front edge support protrusion and a rear edge support protrusion that protrude from the second beam such that the front edge support protrusion and the rear edge support protrusion can horizontally support the substrate in abutting contact with a front edge and a rear edge of the substrate.

2. The walking beam type heat treatment apparatus of claim 1, wherein the front edge support protrusion and the rear edge support protrusion protrude slantly upward respectively such that the front edge support protrusion and the rear edge support protrusion are in abutting contact with lower ridge lines of the front edge and the rear edge of the substrate.

3. The walking beam type heat treatment apparatus of claim 1, wherein the front edge support protrusion and the rear edge support protrusion are provided with a plurality of concaves and convexes engaging with lower ridge lines of the front edge and the rear edge of the substrate, in a portion that the front edge support protrusion and the rear edge support protrusion are in abutting contact with the lower ridge lines of the front edge and the rear edge of the substrate.

4. The walking beam type heat treatment apparatus of claim 1, wherein the side edge support protrusion protrudes from each of the pair of the first beams slantly downward and toward the other of the pair of the first beams such that the side edge support protrusion is in abutting contact with a lower ridge line of the side edge of the substrate.

5. The walking beam type heat treatment apparatus of claim 1, wherein the side edge support protrusion is provided with a gently-inclined portion to support the substrate at a lower ridge line of the side edge of the substrate, and a steeply-inclined portion having a steeper inclination than the gently-inclined portion adjoining to the gently-inclined portion to restrain the substrate from slipping from a predetermined position.

6. The walking beam type heat treatment apparatus of claim 1, wherein:
   the pair of the first beams and the second beam are made of a tubular transparent ceramics;
   the front edge support protrusion, the rear edge support protrusion, and the side edge support protrusion are respectively fixed to a plurality of annular fixed members fixed on an outer circumferential side of the first beam and second beam; and
   the first beam or the second beam and the fixed member is mutually fixed by inserting a locking pin through the first beam or the second beam and the fixed member with a predetermined play.

7. The walking beam type heat treatment apparatus of claim 1, wherein the side edge support protrusion protrudes slantly upward such that the side edge support protrusion is in abutting contact with a lower ridge line of the side edge of the substrate.

8. The walking beam type heat treatment apparatus of claim 1, wherein a distance between a closer end portion to the second beam of the front edge support protrusion and a closer end portion to the second beam of the rear edge support protrusion is shorter than a dimension of the substrate in a longitudinal direction of the substrate.

9. The walking beam type heat treatment apparatus of claim 7, wherein:
   the side edge support protrusion protruding from the one of the pair of the first beams is paired with the side edge support protrusion protruding from the other of the pair of the first beams; and
   the side edge support protrusion protruding from each of the pair of the first beams extends such that a distance between a pair of the side edge support protrusions is decreased, and then the side edge support protrusion turns upward such that the side edge support protrusion slantly extends upward with approaching a side of the first beam.

* * * * *